United States Patent
Chu et al.

(10) Patent No.: US 7,142,463 B2
(45) Date of Patent: Nov. 28, 2006

(54) REGISTER FILE METHOD INCORPORATING READ-AFTER-WRITE BLOCKING USING DETECTION CELLS

(75) Inventors: Sam Gat-Shang Chu, Round Rock, TX (US); Peter Juergen Klim, Austin, TX (US); Michael Ju Hyeok Lee, Austin, TX (US); Jose Angel Paredes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/242,376

(22) Filed: Oct. 3, 2005

(65) Prior Publication Data

US 2006/0039202 A1 Feb. 23, 2006

Related U.S. Application Data

(62) Division of application No. 10/922,247, filed on Aug. 19, 2004, now Pat. No. 7,012,839.

(51) Int. Cl.
*G11C 7/10* (2006.01)
(52) U.S. Cl. ............................ 365/189.08; 365/189.04; 365/233.5

(58) Field of Classification Search ............ 365/189.08, 365/189.04, 233.5, 189.03, 189.05, 185.11, 365/194, 241
See application file for complete search history.

(56) References Cited

U.S. PATENT DOCUMENTS 5,572,467 A * 11/1996 Ghassemi et al. ..... 365/189.02
6,463,002 B1 * 10/2002 Kim et al. ................. 365/222

* cited by examiner

*Primary Examiner*—Richard Elms
*Assistant Examiner*—Dang Nguyen
(74) *Attorney, Agent, or Firm*—Mitch, Harris, Atty at Law, LLC; Andrew M. Harris; Casimer K. Salys

(57) ABSTRACT

A register file method incorporating read-after-write blocking using detection cells provides improved read access times in high performance register files. One or more detection cells identical to the register file cells and located in the register file array are used to control the read operation in the register file by configuring the detection cells to either alternate value at each write or change to a particular value after a write and then detecting when the write has completed by detecting the state change of an active detection cell. The state change detection can be used to delay the leading edge of a read strobe or may be used in the access control logic to delay generation of a next read strobe. The register file thus provides a scalable design that does not have to be tuned for each application and that tracks over voltage and clock skew variation.

7 Claims, 6 Drawing Sheets

REGISTER FILE METHOD INCORPORATING READ-AFTER-WRITE BLOCKING USING DETECTION CELLS

CROSS-REFERENCE TO RELATED APPLICATION

The present application is a divisional of U.S. Patent Application "REGISTER FILE METHOD INCORPORATING READ-AFTER-WRITE BLOCKING USING DETECTION CELLS", Ser. No. 10/922,247, filed on Aug. 19, 2004 now U.S. Pat. No. 7,012,839.

BACKGROUND OF THE INVENTION

1. Technical Field

The present invention relates generally to register file access control circuits, and more particularly to a register file having automatic read-after-write blocking.

2. Description of the Related Art

Register files are commonly used building blocks in digital circuits, particularly in processing system components where fast access to a fairly small quantity of data is required with low access latency. Examples of register file uses include register arrays in processors, cache directories in cache memories.

In contrast to static random access memory (SRAM) cells, register file cells are often written to and then read from within the same clock cycle. For processor core elements where register files are storing machine state information, register files are almost always read immediately after a write in the same clock cycle. Such register files are in the critical path that determines processor speed and as such, the write to read delays are finely tuned to provide the best performance possible within clock skew variation, voltage variation, and other factors that could cause the reading of false or unstable data.

Typical design margins for register file read-after-write timing may waste up to 30% of the clock cycle time by waiting until the write cycle is complete. But such margins are necessary within the typical ranges of the operational variables mentioned above and with current circuits used to implement register file cells and control logic.

Therefore, it would be desirable to further reduce the read-after-write margins to improve register file performance and the performance of processors using register files for storage of values and state information.

SUMMARY OF THE INVENTION

The objectives of improving register file performance and processor performance are achieved in a method.

One or more cells within a register file are dedicated to use as a detection mechanism for determining when the end of a write cycle has occurred. One cell may be used for the entire array, one cell may be assigned for each row in the register file array, or cells may be assigned for groups of rows.

The detection cells may be connected so that the value of the cells alternates at each write operation and the value of an active detection cell is used to control logic that blocks a read to the register file row until the active detection cell changes state. Alternatively, the detection cells may be configured so that a first state is set prior to the commencement of the write cycle and then the detection cells are written with a value corresponding to the opposite state by the write.

The indication of a detection cell state change can be used to truncate the leading edge of a next read strobe to the storage cells affected by the write, or may be used within the access control logic to delay generation of a read strobe that causes a read to the affected cells.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
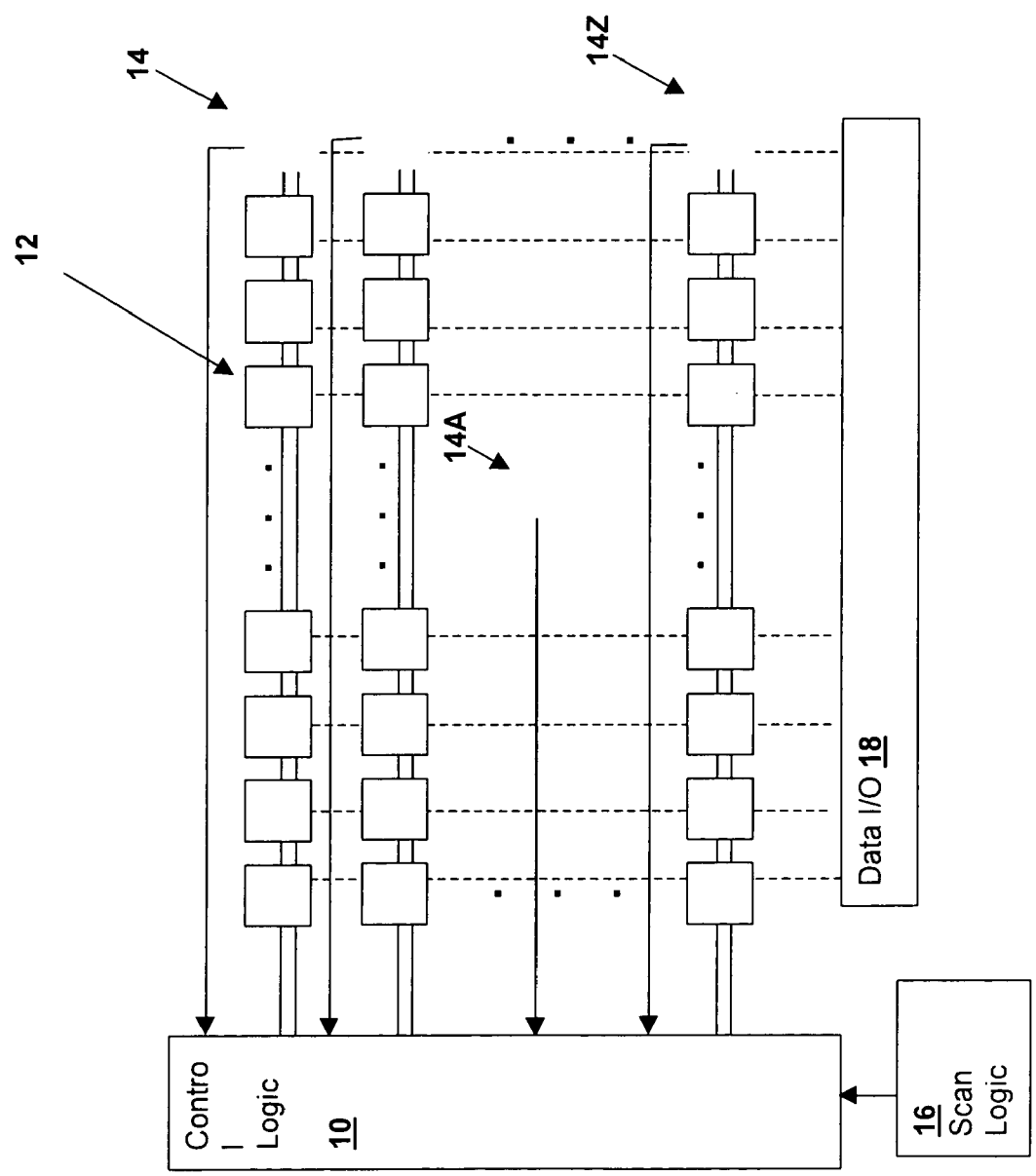
FIG. 1 is a block diagram of a register file in accordance with an embodiment of the invention.

With reference now to the figures, and in particular with reference to FIG. 1, there is depicted a block diagram of a register file circuit embodying a method and an apparatus in accordance with the present invention.

An array of storage cells 12 provide storage for words in rows aligned across the figure. Each bit in the words forms a column running up and down the figure. The physical layout of storage cells 12 generally mimics the layout depicted, but may vary, for example the rows may be partitioned into two or more units, in which case the layout of a portion of the row may mimic that portion of the drawing, but the overall layout of the register file may be split. Storage cells 12 are coupled to a control logic 10 that provides strobe signals that control the individual storage cells 12 in order to perform read and write functions to the registers (rows) within the register file. It should be understood that rows and columns may be interchanged in a particular register file design and that the term "rows" is used herein and in the claims to indicate the group of storage cells corresponding to an individual storage "word", which may be of any bit-width. Control logic 10 also may be coupled to a scan logic 16 that provides testing capability for the register file circuit via generating special functional/scan clock relations to storage cells 12 and detection cells 14. Data input and output buffers/latches 18 provide for input and output of data from storage cells 12.

Unique to the register file disclosed in FIG. 1, is the addition of one or more detection cells 14 (and/or detection cells 14A and 14Z). The detection cells are used to provide a signal that indicates when all of storage cells 12 implicated in a given write operation have assumed the state directed by the data written to storage cells 12. The detection is performed by using cells having characteristics matched to storage cells 12 so that over operational variations such as clock skew, power supply voltage, temperature variations and process variations, the delay between a write strobe and the actual change of data in storage cells 12 will be matched by the delay to produce a state change in detection cell(s) 14 (and/or 14A and 14Z).

The number and location of detection cells can vary in accordance with embodiment of the present invention. Detection cells 14 represent a physical and logical arrangement wherein a detection cell is included for each row and located at the end of each row. It should be understood that the term "end" as used with respect to the term "row" indicates the distant end with respect to the clock (strobe) distribution network. In other words, the end cell in a row is the last to receive a strobe transition. Use of detection cells 14 thereby provides a signal to each row that can indicate when a write to that row should have resulted in a complete state change of any storage cells located in that row. Alternatively, a column of detection cells may be positioned at another location away from the ends of the rows, which is particularly useful in tuning the delay of the detection cell state change to read blocking delay. Other multiple detection cell arrangements are possible, such as providing a detection cell 14 for every other row.

Alternatively, a single detection cell 14A or 14Z may be employed to provide a signal indicating completion of a write. (Or for split arrays, a single cell might be used for each portion of the array). Detection cell 14Z indicates the location of a single cell that corresponds to the end of the last row in the array, wherein "last" is defined in a manner similar to the above for "end", indicating the cell at the distant end of the clock distribution for both columns and rows. Therefore, detection cell 14Z provides an indication that all other cells implicated by a write should have completed their state changes. To ensure that a state change has occurred, the control logic 10 provides some delay for providing a margin of confidence before enabling a read after a write has occurred. In addition, location of detection cells in other locations such as detection cell 14A require that a delay be added to the write completion signal that compensates for the fact that other cells are expected to have state changes occurring later than the state change in detection cell 14A.

In general, the present invention is directed toward a register file circuit that includes one or more detection cells that provide a write complete indication so that reads occurring earlier than the end of the write strobe cycle can be blocked or not generated until there is confidence that the data in storage cells 12 is stable. Detection cells (14, 14Z) can either provide such indication directly, wherein control circuit 10 only includes such additional delay as needed for confidence margin. Or, detection cells such as detection cell 14A can provide an early indication, with delay added either by control logic or the distribution of the indication(s) to control logic so that the confidence margin is achieved. The advantage of the above-described operation is that read strobe timing and skew does not have to be controlled so that the write is known to be completed, which is typically accomplished in the prior art by delaying the read strobe until the write strobe is de-asserted. In some dynamic circuit designs, a fixed margin is added after the beginning of the write strobe and is used to enable the next read.

The result of applying the techniques of the present invention is an increased performance in terms of throughput of a register file circuit. Further, the circuit achieves better delay scaling over operational parameters, permitting increased frequency of operation and a design in which the above-mentioned margin does not have to be evaluated extensively. A further result provides for asynchronous read operations so that a read strobe to the same row is not generated at all until the state changes due to the write cycle are complete.

Figure 2A:
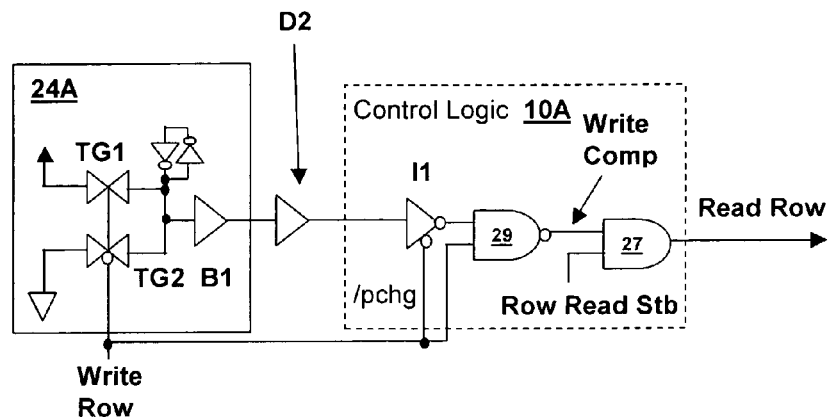
FIG. 2A is a block diagram of a detection cell and associated control logic as may be used in the register file of FIG. 1.

Referring now to FIG. 2A, an example of a detection cell 24A connected to an exemplary control logic 10A that may be used within the control logic 10 circuit of FIG. 1. Detection cell 24A is a modified storage cell having two inputs coupled through transmission gates TG1 and TG2 (or pass gates using one pass transistor) to a buffer B1 with storage on the input of buffer B1. One transmission gate TG1 input is connected to a logical high value and the other input (of TG2) is connected to a logical low value. When Write Row becomes active (logic high), storage cell 24A was previously in logical low state due to the connection of an active low enable input of transmission gate TG2 to the Write Row signal and only transitions to a logical high state after Write Row is asserted and the inherent clock-to-state-change delay of detection cell 24A has elapsed. The logical high state of detection cell 24A is set by activation of transmission gate TG1 upon assertion of Write Row signal.

The output of detection cell 24A is provided to control logic 10A through an optional delay D2, which as mentioned above, may be tuned to compensate for the location of detection cell 24A and may also provide the desired margin of confidence in conjunction with the path delay to control logic 10A and control logic 10A internal delays. Within control logic 10A, logical AND gate 27 qualifies the row read strobe signal Row Read Stb to produce the Read Row signals provided to the read inputs of storage cells 12, so that no read can be asserted to row storage cells 12 prior to the indication from detection cell 24A that the write state change has occurred. The Write Comp signal at an input of AND gate 27 is provided by a logic circuit having a combined static and dynamic function. A specific circuit having the static function incorporated within the dynamic AND gate will be illustrated in detail below in FIG. 6 and the associated description. The summing node of a dynamic domino circuit represented by inverter I1 is connected to an input of a static logical NAND gate 29. The precharge input of inverter I1 is connected to the Write Row signal, so that prior to the commencement of a write to the row, the output of inverter I1 is in a logical high state. Therefore, when the Write Row signal is asserted, both inputs of logical NAND gate 29 assume a logical high value that disables the Row Read Stb signal via AND gate 27 until the inherent clock-to-state-change delay of detection cell 24A has elapsed plus any additional delay due to delay D2.

When the inherent clock-to-state-change delay of detection cell 24A has elapsed plus any additional delay due to delay D2, inverter I1 evaluates, providing a logical low value at the input of NAND gate 29. The output of NAND gate 29 will then assume a logical high state, enabling the Row Read Stb signal via AND gate 27. Inverter I1 will continue to provide a logical low value at the input of NAND gate 29 until the Write Row signal is de-asserted. When Write Row is deasserted, inverter I1 is precharged for the next evaluation, but the connection of the Write Row signal to NAND gate 29 ensures that the output of NAND gate 29 will continue to enable the Row Read Stb signal until the next write to the row begins, which prevents the Read Row cycle from being truncated by de-assertion of the Write Row signal.

While the illustration shows the gating function present in separate control logic 10A (as part of control logic 10 of FIG. 1) it should be understood that the physical location of the gating function can be provided locally at each row cell or by one gate located in the row, with a distribution of the detection cells 14 outputs along the row lines.

Figure 2B:
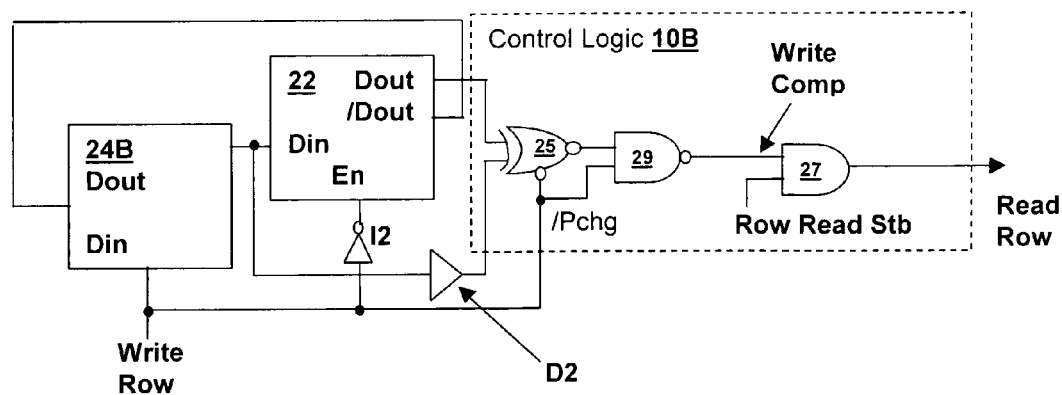
FIG. 2B is a block diagram of another detection cell and associated control logic as may be used in the register file of FIG. 1.

Referring now to FIG. 2B, another detection cell circuit and associated control logic 10B is shown that is particularly advantageous in register file circuits having scannable architecture. In the depicted circuit, detection cell 24B is connected to a scan latch 22 that normally is used to store the value in detection cell 24B for scan testing. However, scan latch 22 attached to detection cell 24B is used for another purpose when in functional (operational) mode. The Write Row signal is connected to the enable input of detection cell 24B (which is a standard storage cell) and an inverted version provided to scan latch 22 via an inverter I2. An inverted output of scan latch 22 is provided to the write data input of storage cell 24B, so that the logical value stored in detection cell 24B alternates at each write strobe. Since the value in scan latch 22 is not updated until after the Write Row signal is de-asserted, initially the values of scan latch 22 and storage cell 24B will be the same and will continue to be the same until the Write Row signal is asserted and the inherent clock-to-state-change delay of detection cell 24B has elapsed.

Control logic 10B detects when the outputs of detection cell 24B and scan latch 22 are different, providing an indication as described above for the circuit of FIG. 2A, optionally delayed by delay D2 that delays the detection cell 24B output change and thereby provides a write complete (WriteComp) signal via a dynamic XNOR gate and static NAND gate 29. A dynamic XNOR circuit having an incorporated static NAND function are shown in detail below in FIG. 5 and the associated description.

The preset input of dynamic XNOR gate 25 is connected to the Write Row signal so that the output of XNOR gate 25 remains in the precharge state except after the Write Row signal has been asserted and before the optionally delayed output of detection cell 24B has changed state due to the write cycle. When the Write Row signal is asserted, both inputs of NAND gate 29 assume a logical high value, as the inputs of XNOR gate 25 are equal at this time, preventing XNOR gate 25 from evaluating. The output of NAND gate 29 will thus be at a logical low level, blocking any Row Read Stb assertion that has arrived before the state change due to the write cycle has occurred. When the inherent clock-to-state-change delay of detection cell 24B has elapsed plus any additional delay due to delay D2, dynamic XNOR gate 25 evaluates, providing a logical low value at the input of NAND gate 29 that is connected to XNOR gate 29. The output of AND gate 29 will then assume a logical high state, enabling the Row Read Stb signal via AND gate 27. Dynamic XNOR gate 25 will continue to provide a logical low value at the input of NAND gate 29 until the Write Row signal is de-asserted and XNOR gate 25 is precharged. The Write Row signal is provided to the other input of NAND gate 29 so that the output of NAND gate 29 continues to be held until the next write cycle to the row, which prevents the Read Row cycle from being truncated by de-assertion of the Write Row signal when the output of scan latch 22 changes state.

Figure 3:
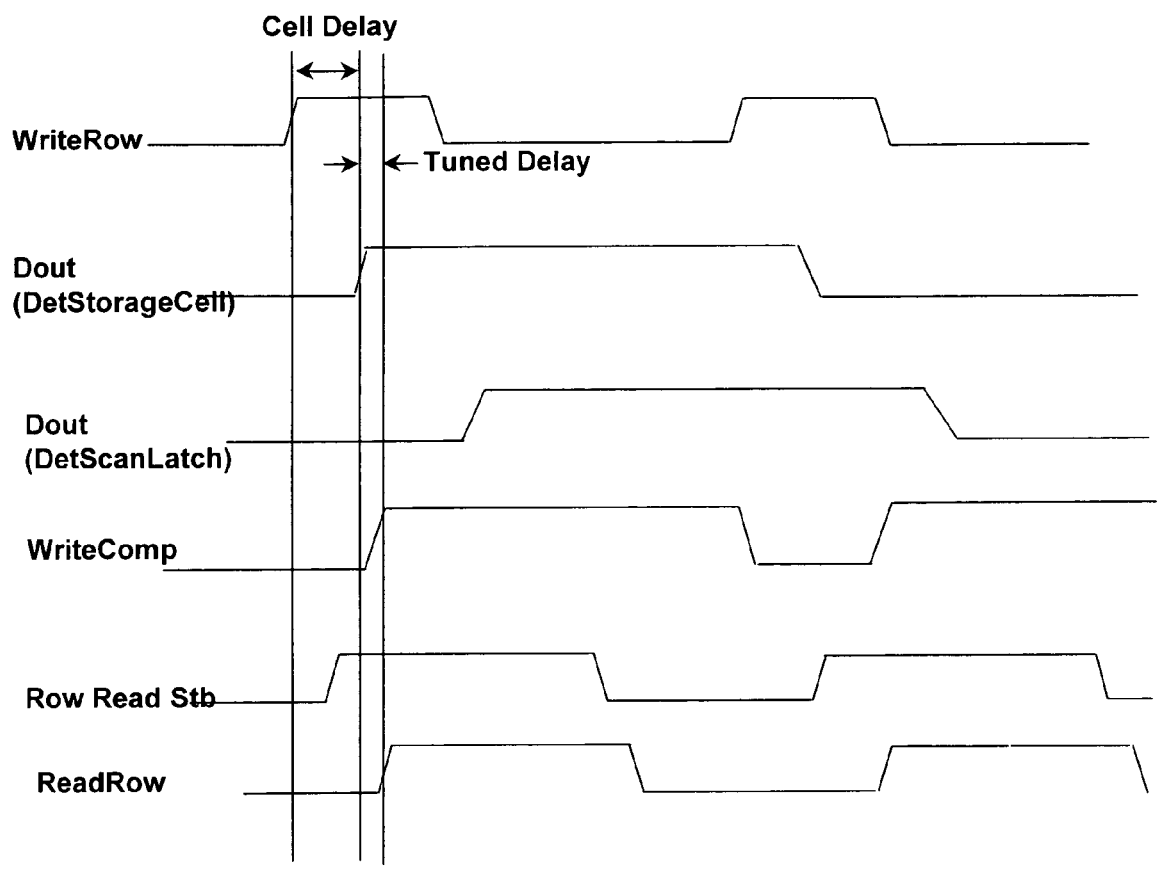
FIG. 3 is a timing diagram depicting the relationship of signals within the register file of FIG. 1.

Referring now to FIG. 3 a timing diagram illustrating the operation of the circuit of FIG. 2B within the register file circuit of FIG. 1 is depicted. For the circuit of FIG. 2A operation for each cycle is similar to the first cycle (left hand side) shown in FIG. 3, as the initial value of the detection cell in FIG. 2A does not alternate between cycles. Upon and prior to receiving a WriteRow signal, the detection cell output (DetStorageCell) matches the scan latch output (DetScanLatch) and the WriteComp signal is low. When the inherent clock-to-state-change delay of detection cell 24B has elapsed, DetStorageCell assumes a value opposite that of DetScanLatch (due to the connection of scan latch 22 inverting output to detection cell 24B input) and XOR gate 25 transitions to a logical high value, providing the WriteComp signal that qualifies the row read strobe RowRead to provide the ReadRow signal that drives the row read strobes to storage cells 12. Thus, as can be seen from FIG. 3 the ReadRow signal is truncated from the RowRead signal until the delay has expired. Also illustrated in the figure is the provision of a cell delay (i.e., the inherent detection cell write strobe to state change delay) added to a tuned delay, which includes the confidence margin and any delay needed to tune for a detection cell that is not guaranteed to be the last cell to transition on a write operation.

Figure 4:
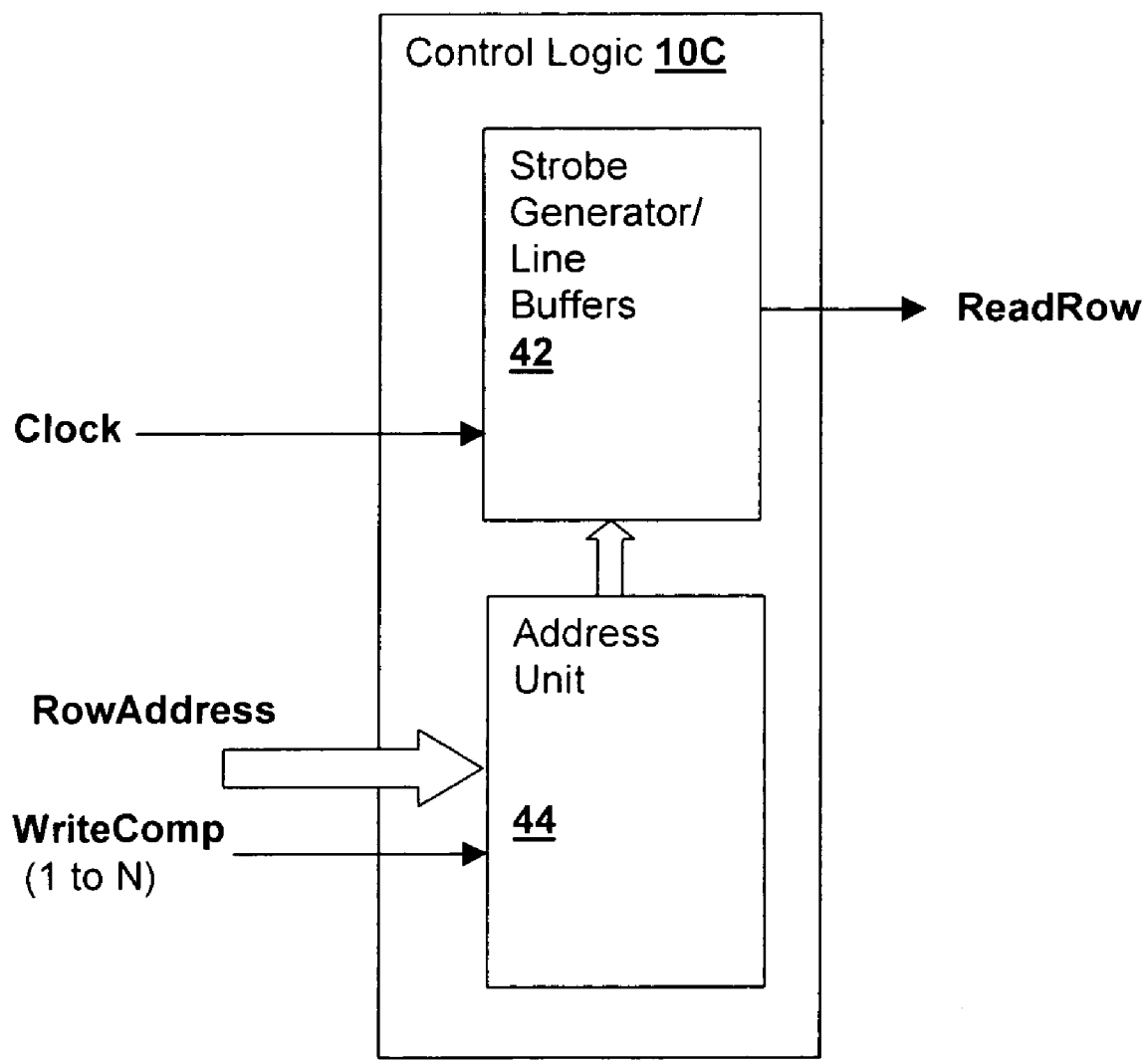
FIG. 4 is a block diagram depicting control logic within the register file of FIG. 1, in accordance with an alternative embodiment of the present invention.

Referring now to FIG. 4, an alternative blocking mechanism is depicted in the form of an alternative control logic 10C as may be employed within the register file circuit of FIG. 1. Control logic 10C receives the Write Comp signal(s) at an address unit 44 that compares a next read address to the previous write address in order to determine whether or not read access to a row needs to be blocked until detection cell(s) 14 have detected that the state changes due to the previous write have occurred. If not, the generation of the Row Read Stb signal is postponed until the WriteComp indication is received. At that time, Strobe generators /line buffers 42 provides the appropriate read strobe.

Figure 5:
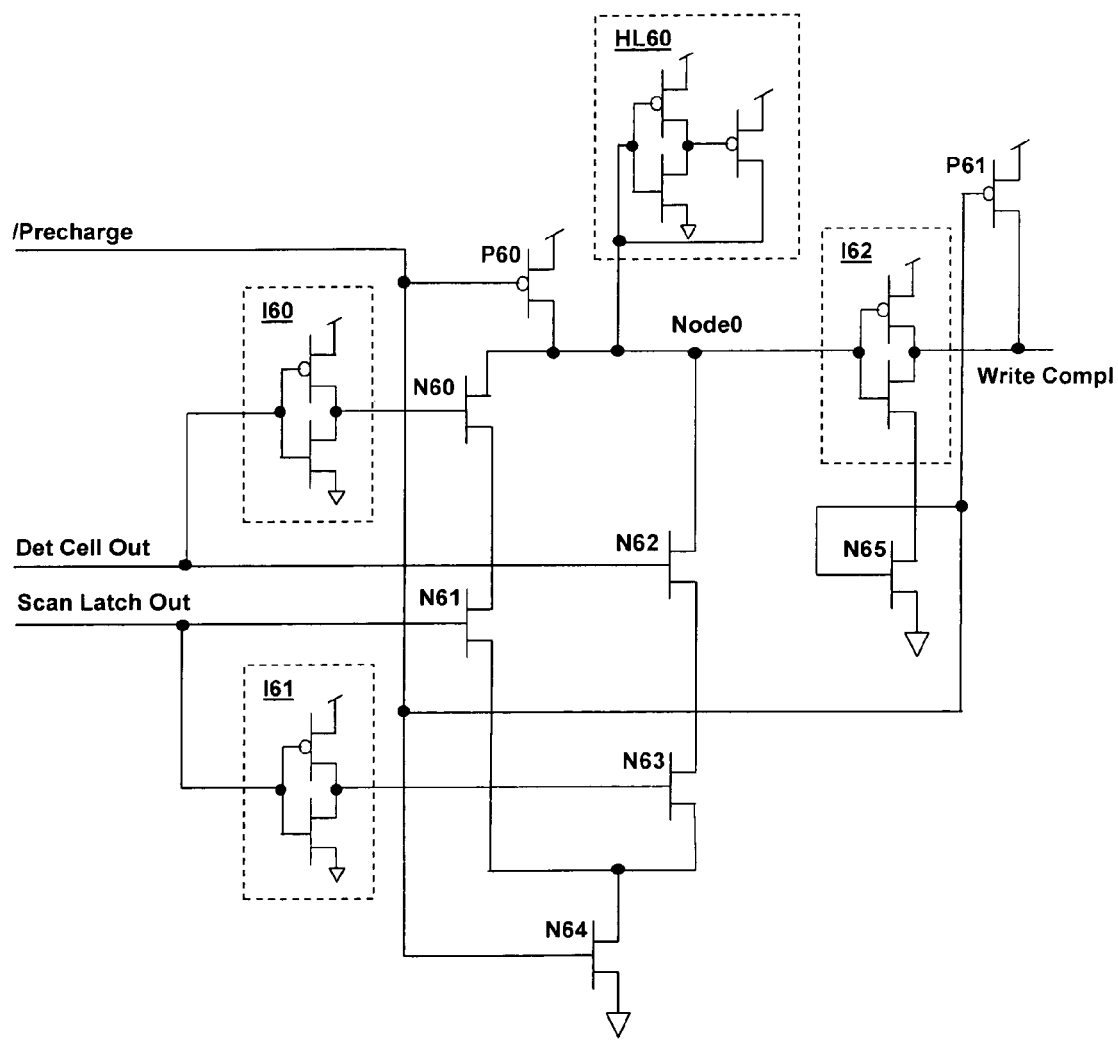
FIG. 5 is a schematic depicting details of dynamic control logic as may be used in the circuit of FIG. 2B.

Referring now to FIG. 5, a specific circuit that may be used to implement control logic 10B of FIG. 2B is shown. The illustrated circuit has advantages in that only a few devices need be added over a standard dynamic XOR gate in order to provide the NAND function, thus implementing the combination of dynamic XNOR 25 and NAND 29. A logical exclusive-NOR function is provided at an internal summing node Node0 by two N-device trees, transistors N60 and N61 forming the first tree and transistors N62 and N63 forming the second tree. The gates of transistors N61 and N63 are driven by scan latch 22 output and a complement provided by inverter I61, respectively. Similarly, transistors N60 and N62 are driven by detection cell 24B output and a complement provided by inverter I60. The resulting function is a dynamic exclusive-NOR at Node 0, with precharge transistor P60 and foot transistor N64 completing the dynamic circuit function. A half-latch HL60 provides that the state of internal node Node0 will be maintained in the absence of the precharge signal both before and after an evaluation has occurred. Inverter I62 transforms the internal node signal Node0 to provide what would be a traditional exclusive-OR function at output Write Compl, but for the presence of output foot transistor N65 and output pull-up transistor P61. When the /Precharge input (in this case the Write Row) signal is in a logic low state (during the absence of the write strobe), foot transistor N65 is turned off, disabling the action of the exclusive-OR by disabling inverter I62. Also, transistor P61 is turned on, causing the output of the circuit to be forced to a logic high value while the /Precharge input is active (thus transistor N65 is necessary in order to prevent shorting the pulled-up output through inverter I62). The operation of the above-described circuit is counter-intuitive in that in typical dynamic logic gates, an output state change from the precharged state is reflective of an evaluated state of the internal summing node. However, in the illustrated circuit, the output state change is made upon de-assertion of the /Precharge signal and remains until the circuit has evaluated. Thus the illustrated circuit is especially suitable for the operation of the present invention, where it is desirable to generate a signal indicative of the time between the initiation of the row write and the change at the control logic input(s) due to the expiration of the inherent detection cell delay.

Figure 6:
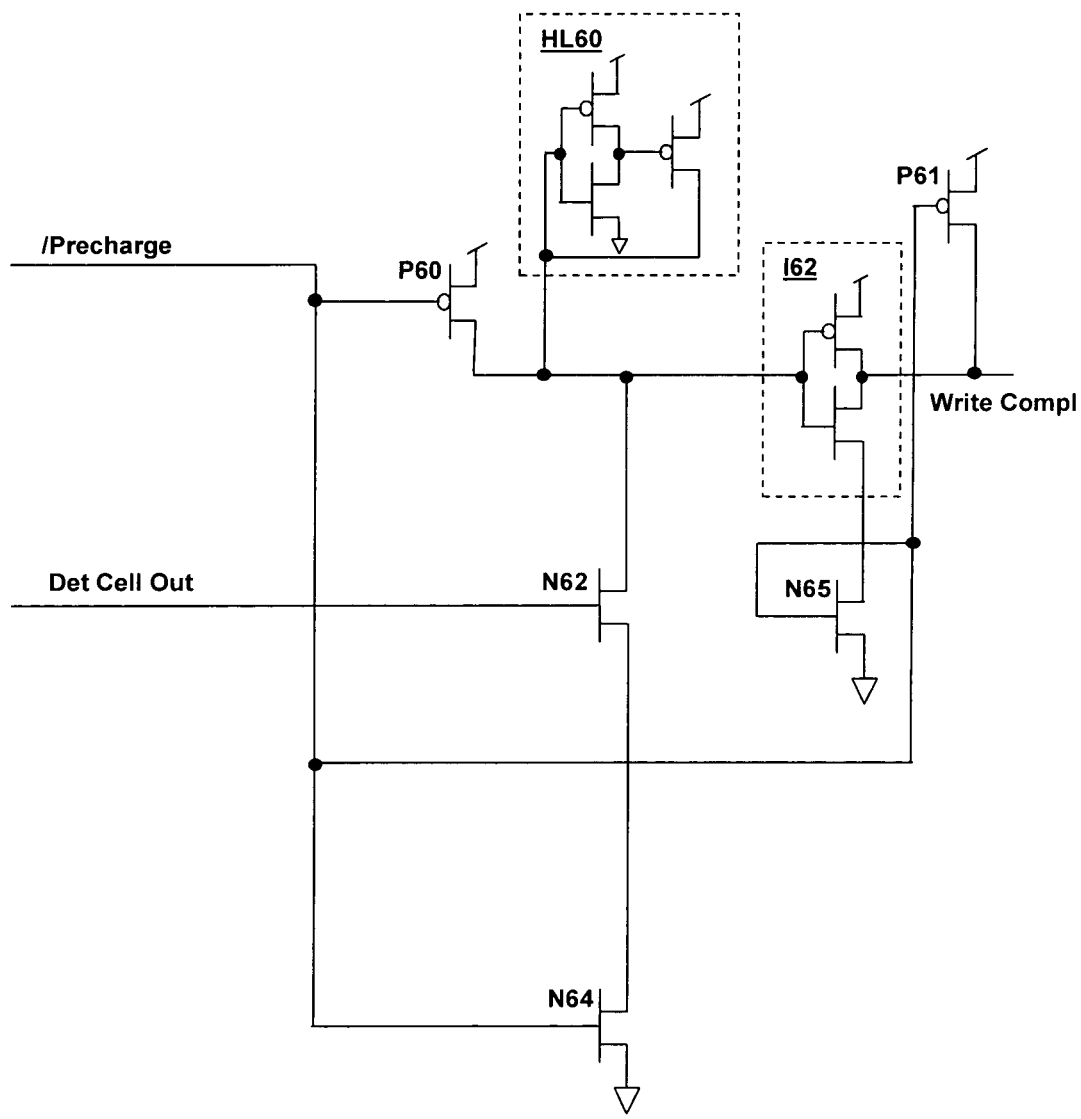
FIG. 6 is a schematic depicting details of dynamic control logic as may be used in the circuit of FIG. 2A.

Referring now to FIG. 6 a specific circuit that may be used to implement control logic 10A of FIG. 2A is shown. The illustrated circuit is a simplification of the circuit of FIG. 5 and thus only differences will be described. The illustrated circuit provides the combined operation of dynamic inverter I1 and NAND gate 29 in the circuit of FIG. 2A. Since only the detection cell output is needed to provide the state change for generating the Write Compl signal along with the Write Row signal used as a precharge signal, only transistor N62 is needed for the evaluation tree and the internal summing node represents a dynamic-logic invert of the detection cell output (i.e., the summing node will be at a logical low value only if the circuit is not in the precharge condition and the detection cell output is in a logical high condition). The balance of the circuit operates as described for the circuit of FIG. 5, with a logical NAND function imposed on the state of the internal summing node where one of the NAND inputs is the /Precharge signal. When the /Precharge signal is de-asserted, the precharged state of the internal summing node will cause the output of the illustrated circuit to transition to a logical low state (after being held up by transistor P61 during the precharge cycle). When the detection cell output transitions to a logical high state, the output of the illustrated circuit will return to a logical high state.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method for reducing read-after-write delays in a register file circuit, comprising:
   writing one or more values to a register within said register file circuit;
   simultaneously with said writing, triggering a state change in at least one dedicated detection cell within said register file circuit;
   blocking read access to said register at commencement of said writing and until said blocking is canceled;
   detecting when said at least one detection cell has changed state as a result of said triggering; and
   canceling said blocking, whereby said register can be read.

2. The method of claim 1, wherein said triggering comprises writing a value corresponding to an opposite state of a current state of said at least one detection cell to said at least one detection cell.

3. The method of claim 2, wherein said at least one detection cell is a scannable register file cell, and wherein said method further comprises storing said current state in a scan latch of said scannable register file cell prior to said writing and wherein said triggering comprises writing a complement of a scan latch current value to said at least one detection cell in response to said writing.

4. The method of claim 1, wherein said wherein said triggering comprises writing a predetermined value to said at least one detection cell, and wherein said method further comprises resetting said at least one detection cell to an opposite value from said predetermined value to said at least one detection cell prior to said writing, whereby said state change occurs from said opposite value to said predetermined value in response to said writing.

5. The method of claim 1, wherein said at least one detection cell is a cell located such that said state change occurs at a time later than any other cell in said register changes value in response to said writing, and wherein said canceling is performed immediately in response to said detecting.

6. The method of claim 1, wherein said at least one detection cell is a cell located such that said state change occurs at a time before another cell in said register changes value in response to said writing, and wherein said method further comprises delaying a result of said detecting for a predetermined time, and wherein canceling is performed in response to an end of said delaying.

7. The method of claim 1, wherein said at least one detection cell comprises a plurality of detection cells, one for each register in said register file circuit, wherein said method further comprises selecting a particular detection cell associated with said register in response to said writing, whereby said triggering triggers said state change in only said particular detection cell.

\* \* \* \* \*